(12) United States Patent
Ishii et al.

(10) Patent No.: US 9,741,885 B2
(45) Date of Patent: Aug. 22, 2017

(54) SOLAR CELL MODULE

(71) Applicant: SANYO Electric Co., Ltd., Osaka (JP)

(72) Inventors: Yousuke Ishii, Osaka (JP); Yoshiyuki Kudoh, Shiga (JP); Akihisa Nakahashi, Osaka (JP)

(73) Assignee: Panasonic Intellectual Property Management Co. Ltd., Osaka (JP)

( * ) Notice: Subject to any disclaimer, the term of this patent is extended or adjusted under 35 U.S.C. 154(b) by 54 days.

(21) Appl. No.: 14/521,547

(22) Filed: Oct. 23, 2014

(65) Prior Publication Data

US 2015/0040961 A1 Feb. 12, 2015

Related U.S. Application Data

(63) Continuation of application No. PCT/JP2013/061911, filed on Apr. 23, 2013.

(30) Foreign Application Priority Data

Apr. 23, 2012 (JP) .................................. 2012-097732

(51) Int. Cl.
*H01L 31/05* (2014.01)

(52) U.S. Cl.
CPC .......... *H01L 31/05* (2013.01); *H01L 31/0508* (2013.01); *H01L 31/0516* (2013.01); *Y02E 10/50* (2013.01)

(58) Field of Classification Search
None
See application file for complete search history.

(56) References Cited

U.S. PATENT DOCUMENTS 5,391,235 A * 2/1995 Inoue ............................ 136/244
5,951,786 A * 9/1999 Gee .................... B32B 17/10018
136/256

(Continued)

FOREIGN PATENT DOCUMENTS

JP 2005-011869 A 1/2005
JP 2005-191479 A 7/2005

(Continued)

OTHER PUBLICATIONS

Definition of support [retrieved from http://www.oxforddictionaries.com/us/definition/american_english/support on May 27, 2015].*

*Primary Examiner* — Eric R Smith
(74) *Attorney, Agent, or Firm* — Mots Law, PLLC

(57) ABSTRACT

A plurality of solar cells are arranged in a first direction and each provided with first and second electrodes on a one main surface side thereof. A wiring member includes a conductive layer and a resin sheet supporting the conductive layer, the conductive layer electrically connecting the first electrode of one of the solar cells adjacent to each other in the first direction to the second electrode of another one of the solar cells. An adhesive layer bonds the wiring member to each of the solar cells. The wiring member includes a first bonded portion bonded to the one solar cell via the adhesive layer, a second bonded portion bonded to the other solar cell via the adhesive layer, and a connection portion connecting the first bonded portion and the second bonded portion together, and an opening is provided in the conductive layer in the connection portion.

18 Claims, 5 Drawing Sheets

(56) References Cited

U.S. PATENT DOCUMENTS

| | | | |
|---|---|---|---|
| 2005/0268959 A1* | 12/2005 | Aschenbrenner et al. | 136/244 |
| 2009/0183759 A1* | 7/2009 | Hishida | 136/244 |
| 2009/0260672 A1* | 10/2009 | Taira | H01L 31/0516 136/244 |
| 2010/0116323 A1 | 5/2010 | Katayama et al. | |
| 2010/0144218 A1* | 6/2010 | Rose et al. | 439/883 |
| 2011/0073165 A1* | 3/2011 | Lee | 136/251 |
| 2011/0086230 A1* | 4/2011 | Takano | C08J 7/12 428/421 |
| 2012/0037203 A1* | 2/2012 | Sainoo | B32B 17/10018 136/244 |
| 2012/0048353 A1* | 3/2012 | Woo | H01L 31/048 136/251 |

FOREIGN PATENT DOCUMENTS

| | | | |
|---|---|---|---|
| JP | 2007-201265 A | 8/2007 | |
| JP | 2008-502149 A | 1/2008 | |
| JP | 2009-176782 A | 8/2009 | |
| JP | 2009-266848 A | 11/2009 | |
| WO | 2005-122282 A2 | 12/2005 | |
| WO | 2007-086300 A1 | 8/2007 | |

* cited by examiner

SOLAR CELL MODULE

CROSS REFERENCE TO RELATED APPLICATIONS

This application is a continuation application of International Application No. PCT/JP2013/061911, filed on Apr. 23, 2013, entitled "SOLAR CELL MODULE", which claims priority based on Article 8 of Patent Cooperation Treaty from prior Japanese Patent Application No. 2012-097732, filed on Apr. 23, 2012, entitled "SOLAR CELL MODULE", the entire contents of which are incorporated herein by reference.

TECHNICAL FIELD

This disclosure relates to a solar cell module.

BACKGROUND ART

In recent years, a solar cell module including back contact solar cells has been known as a solar cell module having excellent photoelectric conversion efficiency. For example, Japanese Patent Application Publication No. 2009-266848 (Patent Document 1) describes a solar cell module including multiple back contact solar cells that are electrically connected to one another with wiring members. In the solar cell module described in Patent Document 1, a rectangular wiring member is bonded to each solar cell in such a manner as to extend from one end portion of the solar cell to the other end portion of the solar cell in a direction perpendicular to a direction in which the solar cells are arranged.

SUMMARY OF THE INVENTION

Generally, a wiring member and a solar cell have different coefficients of thermal expansion from each other. For this reason, a change in the temperature of the solar cell module generates a stress between the solar cell and the wiring member. This stress may cause warpage of the solar cell or separation of the wiring member from the solar cell. Hence, what needs to be achieved is to suppress degradation in reliability of a solar cell module due to the difference between the coefficients of thermal expansion of a solar cell and a wiring member.

A solar cell module according to an embodiment includes multiple solar cells, a wiring member, and a bonding layer. The solar cells are arranged in a first direction. Each solar cell is provided with first and second electrodes on a one main surface side thereof. A wiring member includes a conductive layer and a resin sheet. The conductive layer electrically connects the first electrode of one of the solar cells adjacent to each other in the first direction to the second electrode of another one of the solar cells. The resin sheet supports the conductive layer. The bonding layer bonds the wiring member to each of the solar cells. The wiring member includes a first bonded portion, a second bonded portion, and a connection portion. The first bonded portion is bonded to the one solar cell via the bonding layer. The second bonded portion is bonded to the other solar cell via the bonding layer. The connection portion connects the first bonded portion and the second bonded portion together. An opening is provided in the conductive layer in the connection portion.

DETAILED DESCRIPTION OF EMBODIMENTS

Figure 1:
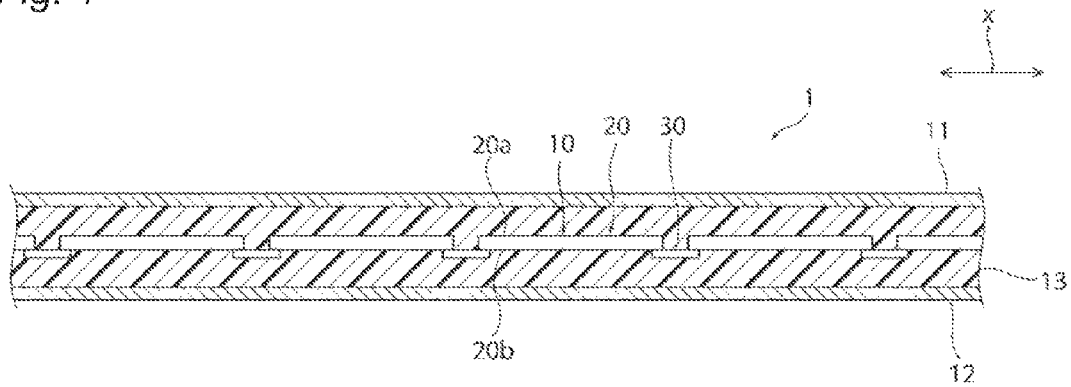
FIG. 1 is a schematic sectional diagram illustrating a solar cell module according to one embodiment of the invention.

Hereinafter, embodiment of the invention are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

As illustrated in FIG. 1, solar cell module 1 includes solar cell string 10. Solar cell string 10 is placed between first protective member 11 located on the light-receiving surface side and second protective member 12 located on the rear surface side. Bonding layer 13 is provided between first protective member 11 and second protective member 12. Solar cell string 10 is sealed by bonding layer 13.

First protective member 11 may be formed of, for example, a glass plate or ceramic plate. Second protective member 12 may be formed of a resin sheet, a resin sheet having a metal foil therein, or the like. Bonding layer 13 may be formed from, for example, an ethylene-vinyl acetate copolymer (EVA) resin, a polyvinyl butyral (PVB) resin, a polyethylene (PE) resin, a polyurethane (PU) resin, or the like.

Solar cell string 10 has multiple solar cells 20 arranged in an x-axis direction (a first direction). Each solar cell 20 has first main surface 20a and second main surface 20b. Solar cell 20 receives light at first main surface 20a. For this reason, first main surface 20a may be called a light-receiving surface, and second main surface 20b may be called a rear surface hereinbelow. Solar cell 20 may be configured to generate power by receiving light only at first main surface 20a forming the light-receiving surface, or may be configured as a both-surface light receiving type capable of generating power by receiving light at both of first and second main surfaces 20a and 20b.

The type of solar cell 20 is not particularly limited. Solar cell 20 may be formed of, for example, a crystal silicon solar cell having a crystalline silicon substrate.

Figure 2:
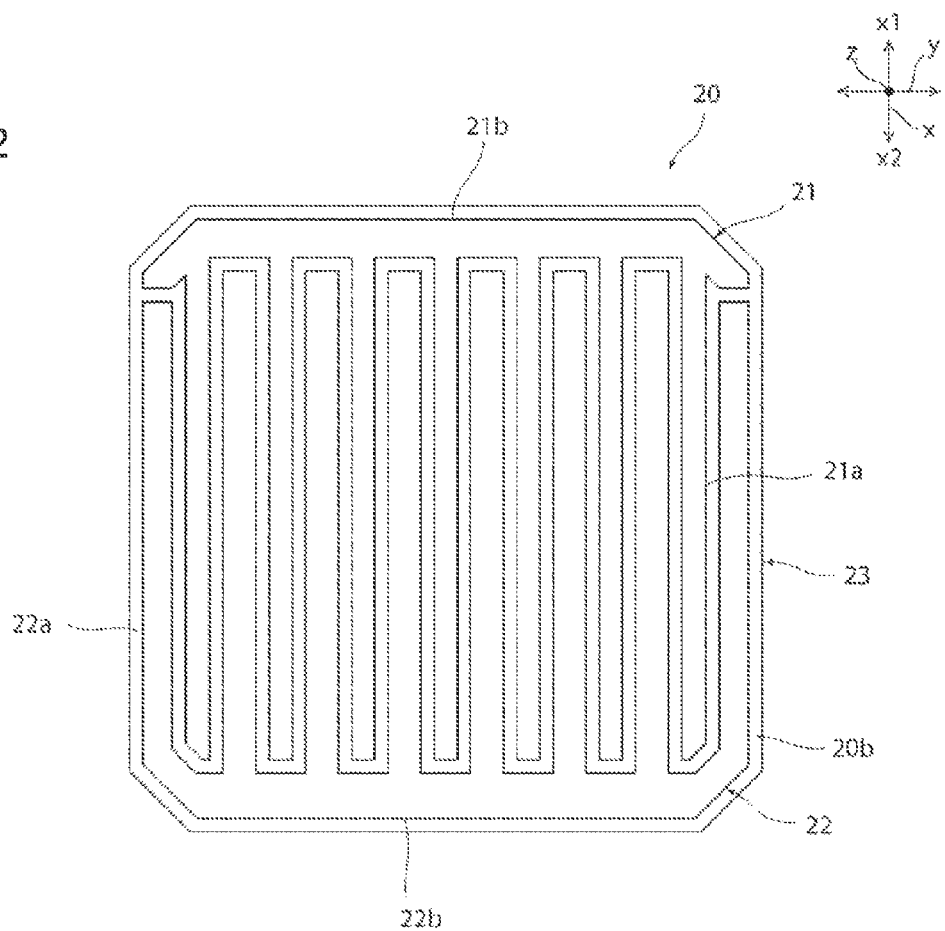
FIG. 2 is a schematic diagram illustrating the rear surface of a solar cell according to the embodiment of the invention.

FIG. 2 is a schematic diagram illustrating the rear surface of solar cell 20. As illustrated in FIG. 2, solar cell 20 has first electrode 21 and second electrode 22 on the second main surface 20b side. Specifically, solar cell 20 has photoelectric conversion body 23 and first and second electrodes 21 and 22 arranged on a back-surface-side main surface of photoelectric conversion body 23.

Each of first and second electrodes 21 and 22 has a comb shape, and finger portions of first electrode 21 and finger portions of second electrode 22 interdigitate and are arranged alternately. More specifically, each of first and second electrodes 21 and 22 has multiple finger portions 21a, 22a and a bus bar 21b, 22b. Finger portions 21a, 22a extend in the x-axis direction, and arranged with spaces therebetween in a y-axis direction (a second direction) intersecting the x-axis direction.

Finger portions 21a are electrically connected to bus bar 21b. Bus bar 21b is placed on one side (x1 side) of finger portions 21a in the x-axis direction. Bus bar 21b is provided at an end portion of solar cell 20 on the x1 side in the x-axis direction in such a manner as to extend from one end portion of solar cell 20 on one side in the y-axis direction to an end portion thereof on the other side in the y-axis direction.

Finger portions 22a are electrically connected to bus bar 22b. Bus bar 22b is placed on the other side (x2 side) of finger portions 22a in the x-axis direction. Bus bar 22b is provided at an end portion of solar cell 20 on the x2 side in the x-axis direction, in such a manner as to extend from one end portion of solar cell 20 on one side in the y-axis direction to an end portion on the other side thereof.

Figure 3:
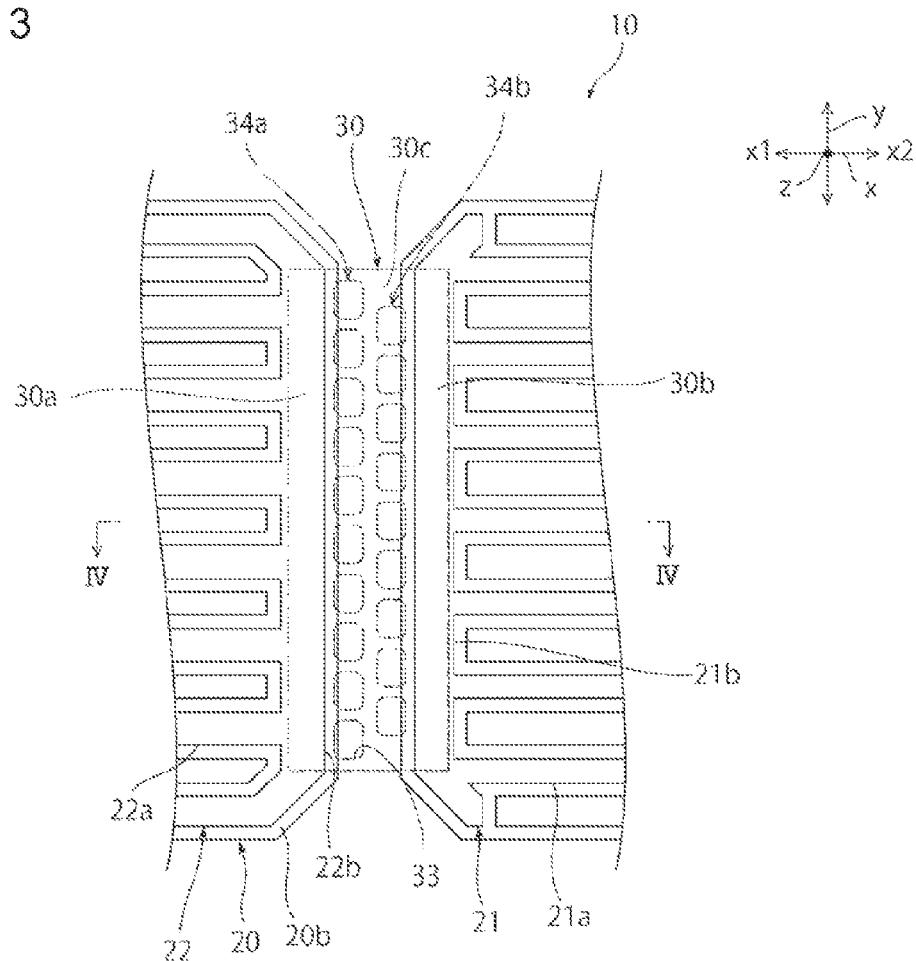
FIG. 3 is a schematic diagram illustrating the rear surface of a solar cell string according to the embodiment of the invention.
Figure 4:
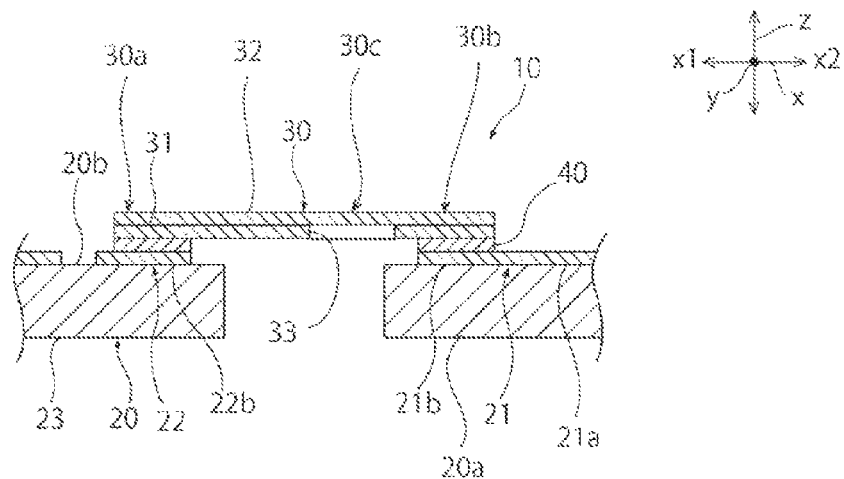
FIG. 4 is a schematic sectional diagram taken along line IV-IV in FIG. 3.

As illustrated in FIGS. 3 and 4, solar cells 20 are electrically connected to each other via wiring member 30. Specifically, first electrode 21 of one of solar cells 20 adjacent to each other in the x-axis direction is electrically connected to second electrode 22 of the other solar cell via wiring member 30.

As illustrated in FIG. 4, wiring member 30 has conductive layer 31 and resin sheet 32. Conductive layer 31 electrically connects first electrode 21 of one of solar cells 20 adjacent in the x-axis direction to second electrode 22 of the other solar cell. Conductive layer 31 may be formed from any appropriate conductive material. Specifically, conductive layer 31 may be formed from, for example, at least one material selected from the group consisting of Cu, Ag, Au, Pt, Ni, and Sn. The thickness of conductive layer 31 may be, for example, about 8 μm to 15 μm.

Conductive layer 31 is placed on top of resin sheet 32. Conductive layer 31 is supported by resin sheet 32. Resin sheet 32 may be formed from, for example, at least one of a polyimide resin, a polyethylene terephthalate (PET) resin, a polyethylene naphthalate (PEN) resin, and a polyethylene (PE) resin. The thickness of resin sheet 32 may be, for example, 1 μm to 50 μm. An adhesive layer may be provided between conductive layer 31 and resin sheet 32.

Wiring member 30 has first bonded portion 30a, second bonded portion 30b, and connection portion 30c. First bonded portion 30a is bonded, via adhesive layer 40, to one of solar cells 20 adjacent in the x-axis direction. Second bonded portion 30b is bonded, via adhesive layer 40, to the other one of solar cells 20 adjacent in the x-axis direction. Adhesive layer 40 may be formed from, for example, a hardened resin adhesive, a hardened resin adhesive containing conductive material, solder, or the like.

First bonded portion 30a and second bonded portion 30b are connected together by connection portion 30c. In connection portion 30c, conductive layer 31 has multiple rectangular openings 33 forming multiple opening rows extending in the y direction, namely opening row 34a and opening row 34b. In conductive layer 31, a portion formed by a space between the openings of opening row 34a and a space between the openings of opening row 34b includes a region where first bonded portion 30a and second bonded portion 30b are not connected to each other linearly in the x-axis direction. However, wiring member 30 may also have a region not conforming to the above-described rule. To be more specific, opening rows 34a, 34b each including multiple openings 33 are provided in the y-axis direction, which is perpendicular to the x-axis direction, with spaces therebetween. Openings 33 of one of opening rows 34a, 34b adjacent in the x-axis direction, e.g., opening row 34a, are aligned with corresponding spaces between openings 33 of the other opening row, i.e., opening row 34b, in the x-axis direction. In other words, opening row 34a and opening row 34b are provided such that that their cycles are shifted from each other in the y-axis direction. In wiring member 30 illustrated in FIG. 3, conductive layer 31 is provided, at end portions thereof in the y-axis direction, with regions where first bonded portion 30a and second bonded portion 30b are connected to each other linearly in the x-axis direction. Each opening 33 preferably has rounded corner portions (curved corner portions).

Openings 33 are covered by resin sheet 32. In other words, resin sheet 32 is provided also on the portion where openings 33 are provided. Openings 33 may be formed by etching.

In general, solar cell 20 and wiring member 30 have different coefficients of thermal expansion from each other. For this reason, a change in the temperature of solar cell module 1 generates a stress between solar cell 20 and wiring member 30. This stress generated between solar cell 20 and wiring member 30 may cause warpage of solar cell 20 or separation of wiring member 30 from solar cell 20.

In solar cell module 1, openings 33 provided in connection portion 30c of conductive layer 31 increase the properties of connection portion 30c to extend or contract. Thereby, the stress applied to solar cell 20 and wiring member 30 when the temperature of solar cell module 1 changes is lessened. It is therefore possible to suppress warpage of solar cell 20 or separation of wiring member 30 from solar cell 20. As a result, solar cell module 1 with improved reliability is obtained.

Moreover, in solar cell module 1, openings 33 are provided such that conductive layer 31 has no portion where first bonded portion 30a and second bonded portion 30b are connected to each other linearly in the x-axis direction. To be more specific, multiple opening rows 34a, 34b each including multiple openings 33 are provided in the y-axis direction, which is perpendicular to the x-axis direction, with spaces therebetween. Their multiple openings 33 are provided such that openings 33 of one of opening rows 34a, 34b adjacent in the x-axis direction, e.g., opening row 34a, are aligned with corresponding spaces between openings 33 of the other opening row, i.e., opening row 34b, in the x-axis direction. Thereby, the properties of connection portion 30c to extend or contract are increased. Thus, the stress applied to solar cell 20 and wiring member 30 when the temperature of solar cell module 1 changes is lessened more effectively. As a result, solar cell module 1 with further improved reliability is obtained.

From the perspective of improving the properties of the connection portion to extend or contract, it is conceivable to provide the openings not only in the conductive layer, but also in the resin sheet. However, providing both of the conductive layer and the resin sheet with the openings lowers the rigidity of the connection portion. This decreases the shape stability of the wiring member, and therefore may lower the workability in connecting solar cell 20 and wiring member 30 together, or more specifically, the workability in positioning performed before connecting solar cell 20 and wiring member 30 together. Increasing the thickness of at least one of the conductive layer and the resin sheet can increase the rigidity of the connection portion, but decreases the properties of the connection portion to extend or contract, making it hard to lessen the stress applied to solar cell 20 and wiring member 30 when the temperature of the solar cell module 1 changes.

Providing the resin sheet 32 with no opening as in solar cell module 1 enables suppression of lowering of the rigidity of connection portion 30c, which would occur if the resin sheet 32 were also provided with openings 33. Thus, both of improvement in the properties of connection portion 30c to extend or contract and suppression of lowering of the rigidity of connection portion 30c can be achieved. As a result, solar cell module 1 with improved reliability can be obtained.

In solar cell module 1, openings 33 each have a rectangular shape having curved corner portions. Such a shape makes it hard for connection portion 30c to get cracks or the like when connection portion 30c extends. Thus, the reliability of solar cell module 1 can be improved even more.

Figure 5:
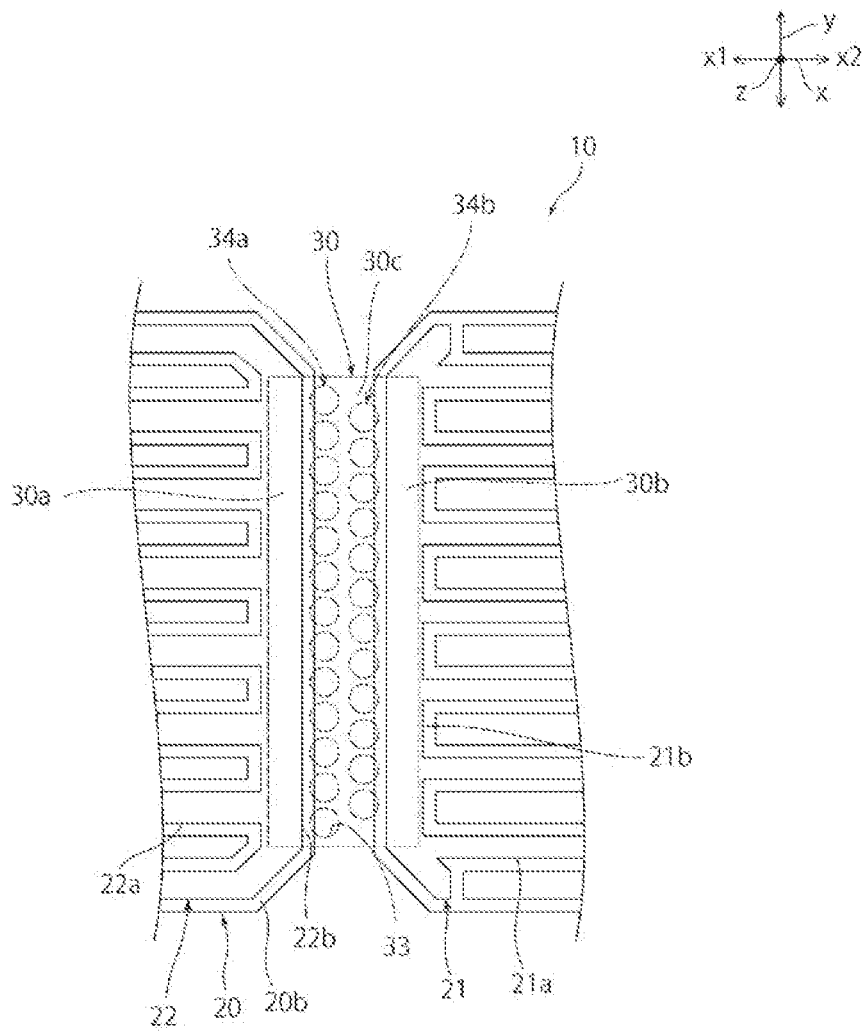
FIG. 5 is a schematic diagram illustrating the rear surface of a solar cell string according to a first modification.
Figure 6:
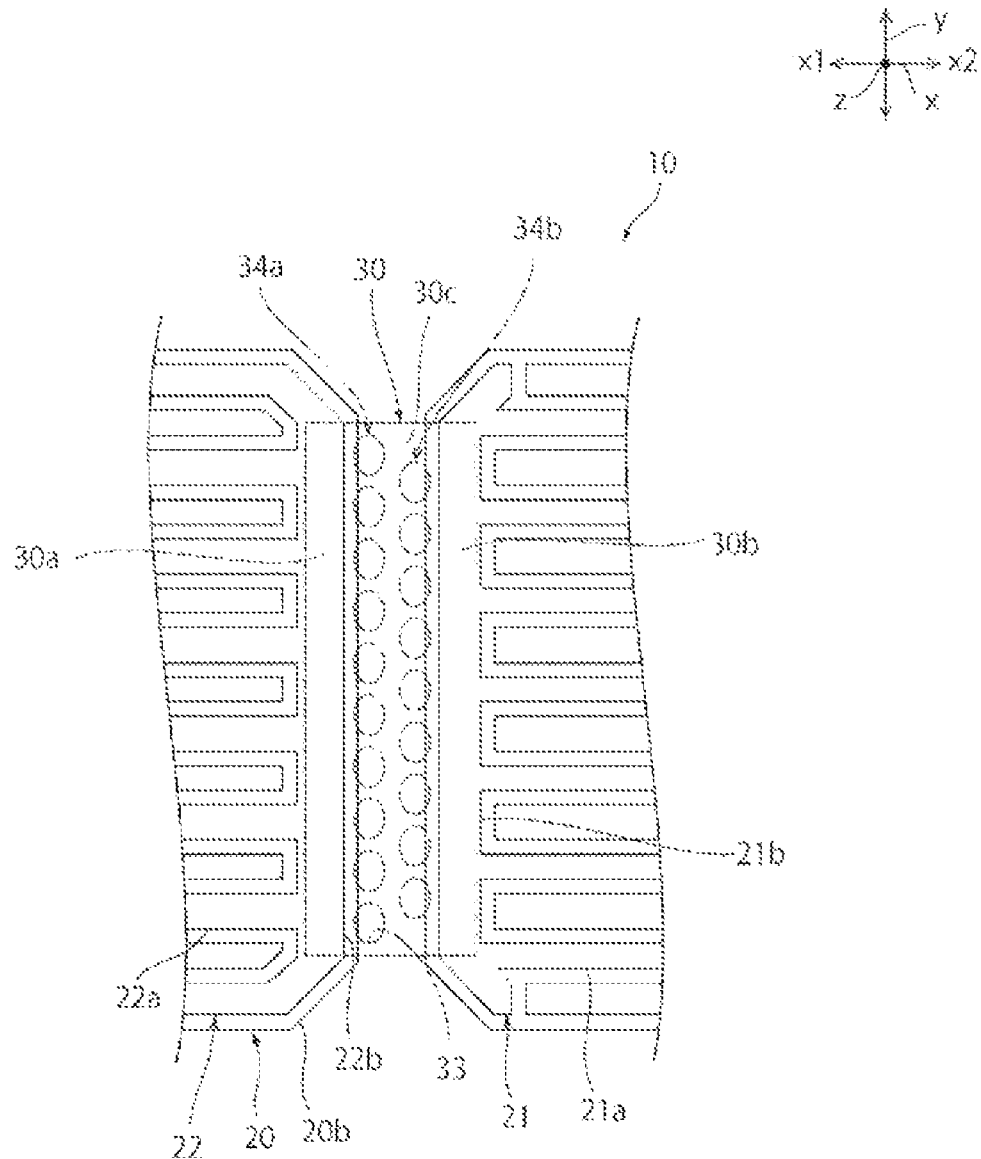
FIG. 6 is a schematic diagram illustrating the rear surface of a solar cell string according to a second modification.
Figure 7:
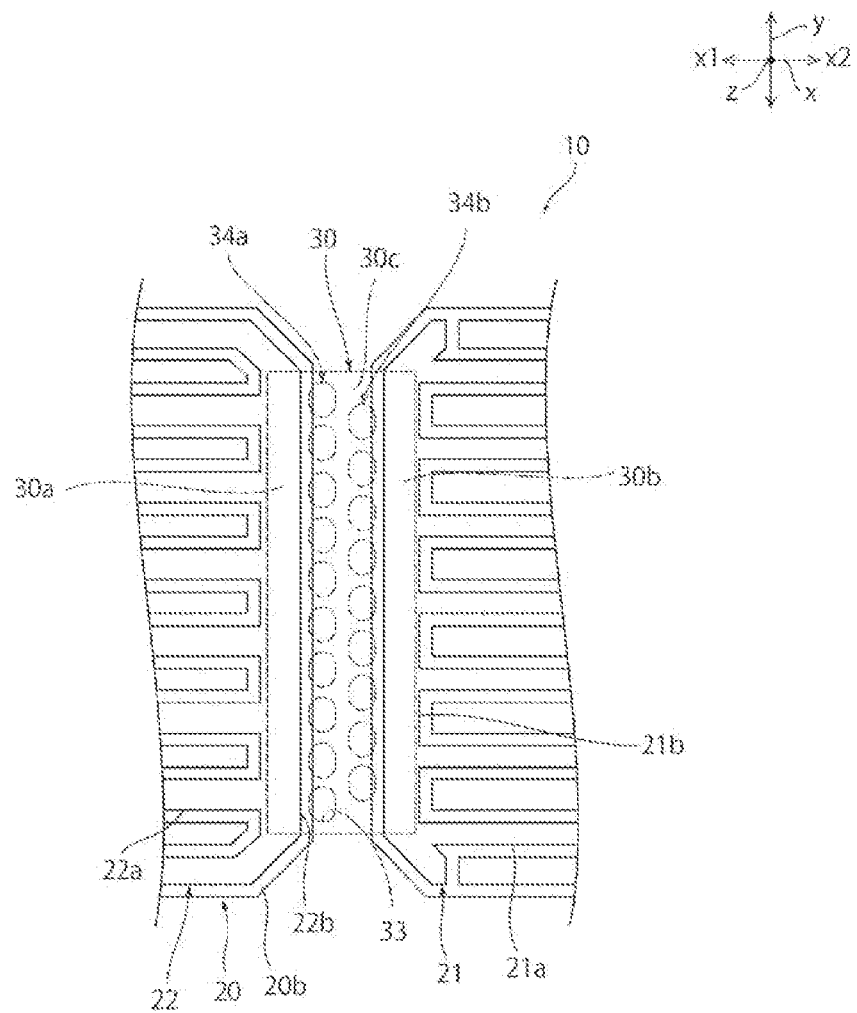
FIG. 7 is a schematic diagram illustrating the rear surface of a solar cell string according to a third modification.

Similar effects can be obtained when opening 33 is, for example, circular as illustrated in FIG. 5, elliptical as illustrated in FIG. 6, or oval as illustrated in FIG. 7.

In this way, the embodiments above provide solar cell modules with improved reliability.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell module comprising:
   a first protective member including a glass plate or a ceramic plate and arranged at a side of a light receiving surface;
   a second protective member including a resin sheet and arranged on a side of a back surface;
   a plurality of solar cells arranged in a first direction between the first protective member and the second protective member and each provided with first and second electrodes on a one main surface side thereof;
   a bonding layer arranged between the first protective member and the second protective member and sealing the plurality of solar cells;
   a wiring member including a conductive layer and a resin sheet supporting the conductive layer arranged between the first protective member and the second protective member, the conductive layer electrically connecting the first electrode of one of the solar cells adjacent to each other in the first direction to the second electrode of another one of the solar cells and sandwiched between the resin sheet of the wiring member and the solar cells; and
   an adhesive layer bonding the wiring member to each of the solar cells, wherein the wiring member includes
      a first bonded portion bonded to the one solar cell via the adhesive layer,
      a second bonded portion bonded to the other solar cell via the adhesive layer, and
      a connection portion connecting the first bonded portion and the second bonded portion together, the connection portion being between the first bonded portion and the second bonded portion in the first direction, and wherein
   the conductive layer in the connection portion has a plurality of openings such that the resin sheet covers the plurality of openings, the plurality of openings comprising,
   a first opening row and a second opening row are immediately adjacent each other in the first direction, each opening row including a plurality of the openings provided in a second direction perpendicular to the first direction, with spaces therebetween,
   the openings of the first opening row are aligned with corresponding portions in the second opening row in the first direction, the corresponding portions being provided with no opening, and
   a length of the space in the first opening row in the second direction is same as a length of the space in the second opening row in the second direction.

2. The solar cell module according to claim 1, wherein in the conductive layer, a portion formed by a space between the openings of the first opening row and a space between the openings of the second opening row includes a region where the first and second bonded portions are not connected to each other linearly in the first direction.

3. The solar cell module according to claim 1, wherein between the first bonded portion and the second bonded portion, the conductive layer includes a portion which is linearly continuous in the first direction.

4. The solar cell module according to claim 1, wherein a shape of each of the opening is one of a rectangle with rounded corner portions, a circle, an ellipse, and an oval.

5. The solar cell module according to claim 1, wherein the first direction is parallel to edges of the one of the solar cells adjacent to each other in the first direction and to the another one of the solar cells.

6. The solar cell module according to claim 1, wherein the openings each have curved corner portions.

7. A solar cell module comprising:
   a first protective member including a glass plate or a ceramic plate and arranged at a side of a light receiving surface;
   a second protective member including a resin sheet and arranged on a side of a back surface;
   a plurality of solar cells arranged in a first direction between the first protective member and the second protective member and each provided with first and second electrodes on a one main surface side thereof;
   a bonding layer arranged between the first protective member and the second protective member and sealing the plurality of solar cells;
   a wiring member including a conductive layer and a resin sheet supporting the conductive layer arranged between the first protective member and the second protective member, the conductive layer electrically connecting the first electrode of one of the solar cells adjacent to each other in the first direction to the second electrode of another one of the solar cells and sandwiched between the resin sheet of the wiring member and the solar cells; and
   an adhesive layer bonding the wiring member to each of the solar cells, wherein the wiring member includes
      a first bonded portion bonded to the one solar cell via the adhesive layer, a second bonded portion bonded to the other solar cell via the adhesive layer, and a connection portion connecting the first bonded portion and the second bonded portion together, the connection portion being between the first bonded portion and the second bonded portion in the first direction, and wherein the conductive layer in the connection portion has a plurality of openings such that the resin sheet covers the plurality of openings, the plurality of openings comprising, a first opening row and a second opening row immediately adjacent each other in the first direction, each opening row including a plurality of the openings provided in a second direction perpendicular to the first direction, with spaces therebetween, all spaces in the first opening row have a same length in the second direction as each other, and all spaces in the second opening row have a same length in the second direction as each other.

8. The solar cell module according to claim 1, wherein a plane area of the resin sheet is larger than a plane area of the conductive layer.

9. A solar cell module comprising:
a first protective member including a glass plate or a ceramic plate and arranged at a side of a light receiving surface;
a second protective member including a resin sheet and arranged on a side of a back surface;
a plurality of solar cells arranged in a first direction between the first protective member and the second protective member and each provided with first and second electrodes on a one main surface side thereof;
a bonding layer arranged between the first protective member and the second protective member and sealing the plurality of solar cells;
a wiring member including a conductive layer and a resin sheet supporting the conductive layer arranged between the first protective member and the second protective member, the conductive layer electrically connecting the first electrode of one of the solar cells adjacent to each other in the first direction to the second electrode of another one of the solar cells and sandwiched between the resin sheet of the wiring member and the solar cells; and
an adhesive layer bonding the wiring member to each of the solar cells, wherein the wiring member includes
a first bonded portion bonded to the one solar cell via the adhesive layer,
a second bonded portion bonded to the other solar cell via the adhesive layer, and
a connection portion connecting the first bonded portion and the second bonded portion together, the connection portion being between the first bonded portion and the second bonded portion in the first direction, and wherein the conductive layer in the connection portion has a plurality of openings such that the resin sheet covers the plurality of openings, and the conductive layer and the resin sheet have a same outline shape as each other in a planar view thereof.

10. The solar cell module according to claim 9, wherein the plurality of openings comprises a plurality of opening rows extending in a second direction intersecting the first direction.

11. The solar cell module according to claim 10, wherein in the conductive layer, a portion formed by a space between the openings of one of the opening rows and a space between the openings of another one of the opening rows includes a region where the first and second bonded portions are not connected to each other linearly in the first direction.

12. The solar cell module according to claim 9, wherein a plurality of opening rows are provided in the first direction, each opening row including a plurality of the openings provided in a second direction perpendicular to the first direction, with spaces there between, and the openings of one of the opening rows adjacent in the first direction are aligned with corresponding portions in another one of the opening rows in the first direction, the corresponding portions being provided with no opening.

13. The solar cell module according to claim 10, wherein between the first bonded portion and the second bonded portion, the conductive layer includes a portion which is linearly continuous in the first direction.

14. The solar cell module according to claim 9, wherein a shape of each of the plurality of openings is one of a rectangle with rounded corner portions, a circle, an ellipse, and an oval.

15. The solar cell module according to claim 12, wherein the first direction is parallel to edges of the one of the solar cells adjacent to each other in the first direction and to the another one of the solar cells.

16. The solar cell module according to claim 9, wherein each of the plurality of openings has curved corner portions.

17. The solar cell module according to claim 9, wherein a plurality of opening rows are provided in the first direction, each opening row including a plurality of the openings provided in a second direction perpendicular to the first direction, with spaces there between, and a length of the space in one of the opening rows in the second direction is a same as a length of the space in another one of the opening rows in the second direction.

18. The solar cell module according to claim 9, wherein a plane area of the resin sheet is larger than a plane area of the conductive layer.

* * * * *